United States Patent
Pan et al.

(10) Patent No.: US 9,397,089 B2
(45) Date of Patent: Jul. 19, 2016

(54) GROUP III-V HEMT HAVING A SELECTABLY FLOATING SUBSTRATE

(71) Applicant: International Rectifier Corporation, El Segundo, CA (US)

(72) Inventors: Yang Pan, Chandler, AZ (US); Mohamed Imam, Chandler, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/728,206

(22) Filed: Jun. 2, 2015

(65) Prior Publication Data

US 2015/0371986 A1    Dec. 24, 2015

Related U.S. Application Data

(60) Provisional application No. 62/015,631, filed on Jun. 23, 2014.

(51) Int. Cl.
| | |
|---|---|
| *H01L 27/02* | (2006.01) |
| *H01L 27/06* | (2006.01) |
| *H01L 29/20* | (2006.01) |
| *H01L 23/538* | (2006.01) |
| *H01L 29/778* | (2006.01) |
| *H01L 29/861* | (2006.01) |
| *H01L 21/768* | (2006.01) |
| *H01L 29/10* | (2006.01) |
| *H01L 29/267* | (2006.01) |

(52) U.S. Cl.
CPC ........ *H01L 27/027* (2013.01); *H01L 21/76898* (2013.01); *H01L 27/0266* (2013.01); *H01L 27/0617* (2013.01); *H01L 27/0629* (2013.01); *H01L 29/7786* (2013.01); *H01L 29/8616* (2013.01); *H01L 29/1075* (2013.01); *H01L 29/2003* (2013.01); *H01L 29/267* (2013.01); *H01L 29/8611* (2013.01)

(58) Field of Classification Search
CPC ............ H01L 27/0266; H01L 27/0617; H01L 23/5384; H01L 29/2003; H01L 29/7787; H01L 27/027; H01L 27/0629; H01L 21/76898; H01L 29/7786; H01L 29/8616; H01L 29/1075; H01L 29/267; H01L 29/8611
See application file for complete search history.

(56) References Cited

U.S. PATENT DOCUMENTS

| | | | |
|---|---|---|---|
| 8,405,147 B2 | 3/2013 | Brindle | |
| 2013/0009165 A1 | 1/2013 | Park | |
| 2014/0049296 A1* | 2/2014 | Jeon | ...................... H03K 3/012 327/109 |
| 2014/0367700 A1 | 12/2014 | Prechtl | |

* cited by examiner

*Primary Examiner* — Whitney T Moore
(74) *Attorney, Agent, or Firm* — Farjami & Farjami LLP

(57) ABSTRACT

There are disclosed herein various implementations of a group III-V high electron mobility transistor (HEMT) having a selectably floating substrate. Such a group III-V HEMT is situated over a substrate, and includes a transistor configured to selectably couple the substrate to ground and to selectably decouple the substrate from ground. The transistor is configured to ground the substrate when the group III-V HEMT is in an off-state and to cause the substrate to float when the group III-V HEMT is in an on-state.

20 Claims, 7 Drawing Sheets

US 9,397,089 B2

GROUP III-V HEMT HAVING A SELECTABLY FLOATING SUBSTRATE

The present application claims the benefit of and priority to a provisional application entitled "Integrated III-Nitride Device and P-Channel Silicon DMOS," Ser. No. 62/015,631 filed on Jun. 23, 2014. The disclosure in this provisional application is hereby incorporated fully by reference into the present application.

BACKGROUND

I. Definition

As used herein, the phrase "group III-V" refers to a compound semiconductor including at least one group III element and at least one group V element. By way of example, a group III-V semiconductor may take the form of a III-Nitride semiconductor. "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1,200V), or higher.

II. Background Art

In high power and high performance circuit applications, group III-V field-effect transistors (FETs), such as gallium nitride (GaN) or other III-Nitride based high mobility electron transistors (HEMTs), are often desirable for their high efficiency and high-voltage operation. III-Nitride and other group III-V HEMTs operate using polarization fields to generate a two-dimensional electron gas (2-DEG) allowing for high current densities with low resistive losses. Although their high breakdown voltage, high current density, and very low specific on-resistance render group III-V HEMTs potentially advantageous for use in power applications, III-Nitride and other group III-V HEMTs are susceptible to having their performance degraded due to charge trapping.

Charge trapping may result from the presence of charge centers residing in the various material layers used to fabricate the HEMT, as well as at interfaces between those layers. For example, charge centers may be found in or at the interface of the device substrate, transition layers, and buffer layers underlying the active channel and barrier layers of a group III-V HEMT, as well as in or at the interface of the capping, passivation, dielectric, and package material layers overlying the active channel and barrier layers of the group III-V HEMT. One undesirable result of the presence of such charge centers is manifested as a short term trapping phenomenon in which the dynamic on-resistance or d-$R_{dson}$ of the HEMT is temporarily increased during pulsed applications.

SUMMARY

The present disclosure is directed to a group III-V HEMT having a selectably floating substrate, substantially as shown in and/or described in connection with at least one of the figures, and as set forth in the claims.

DETAILED DESCRIPTION

Figure 1A:
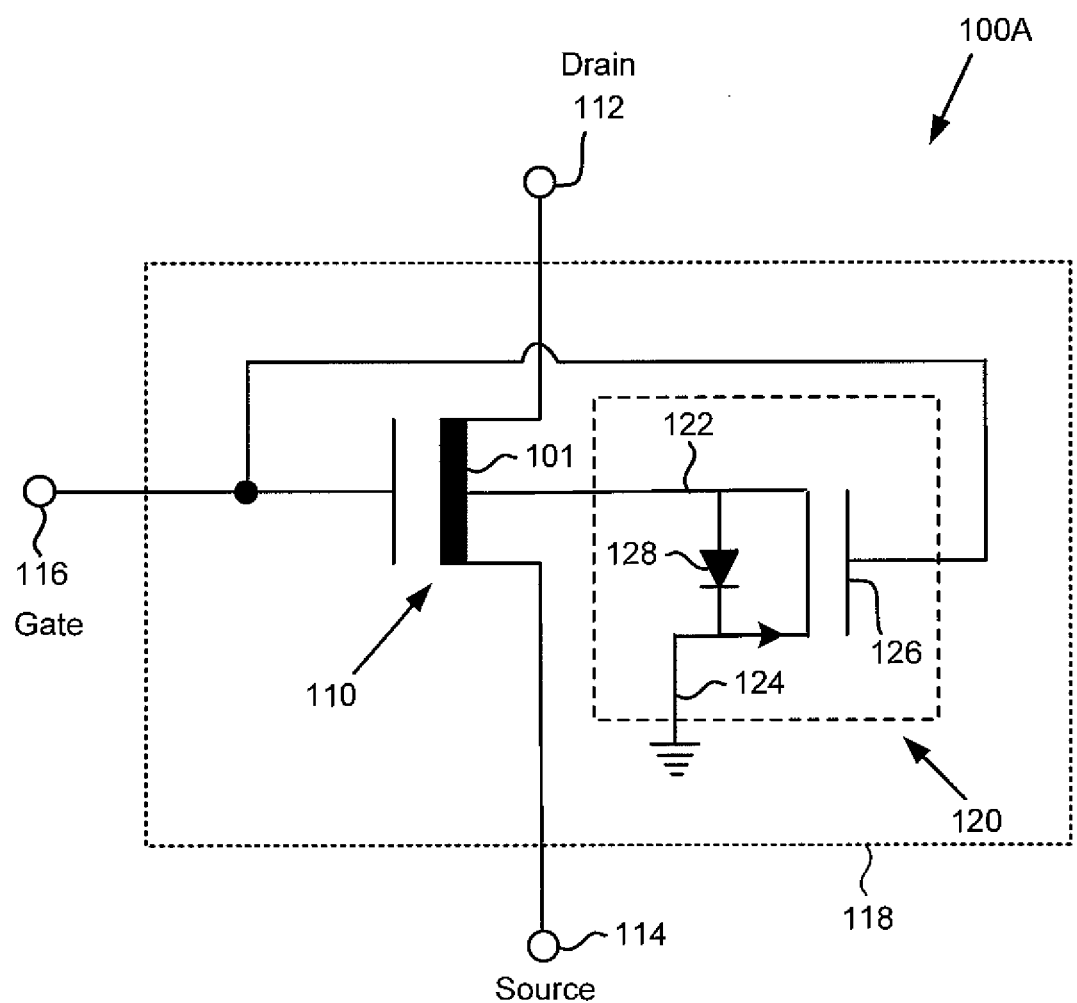
FIG. 1A shows a diagram of an exemplary group III-V high electron mobility transistor (HEMT) having a selectably floating substrate, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, despite their many desirable performance characteristics, including high breakdown voltage, high current density, and very low specific on-resistance, III-Nitride and other group III-V high electron mobility transistors (HEMTs) are susceptible to having their performance degraded due to charge trapping. As further noted above, charge trapping may result from the presence of charge centers residing in the various material layers used to fabricate the HEMT, as well as at interfaces between those layers. For example, charge centers may be found in or at the interface of the device substrate, transition layers, and buffer layers underlying the active channel and barrier layers of a group III-V HEMT, as well as in or at the interface of the capping, passivation, dielectric, and package material layers overlying the active channel and barrier layers of the group III-V HEMT.

The causes of charge trapping are varied, and may include charge centers formed as point defects in the group III-V material (impurities, vacancies, interstitials, for example) or charge centers in the form of dangling bonds at the various bulk, surface, and layer interfaces. The fields arising from these charge centers are typically not screened from the device two-dimensional electron gas (2-DEG) and can degrade the transport properties of the high mobility electrons in the device 2-DEG. One undesirable result of the presence of such charge centers is manifested as a short term trapping phenomenon in which the dynamic on-resistance or d-$R_{dson}$ of the HEMT is temporarily increased during pulsed applications.

The present application discloses group III-V HEMTs configured to have selectably floating substrates enabling prevention of the increase in d-$R_{dson}$ seen in the conventional art during pulsed operation. According to the present inventive principles, the performance of such a group III-V HEMT for direct current (DC) applications is substantially optimized by coupling the substrate of the group III-V HEMT to ground when the group III-V HEMT is in an off-state. It is noted that coupling the substrate to ground and/or "grounding" the substrate in the present application refer to bringing the substrate voltage to a voltage equal to ground voltage or within 0.7 volts of ground voltage. Moreover, by selectably decoupling the group III-V HEMT substrate from ground and enabling the substrate to float when the group III-V HEMT is in an on-state, the implementations disclosed herein advantageously reduce or substantially eliminate an increase in d-$R_{dson}$ during pulsed operation.

FIG. 1A shows diagram 100A of an exemplary group III-V HEMT having a selectably floating substrate, according to one implementation. Diagram 100A shows group III-V HEMT 110 having drain 112, source 114, and gate 116. As further shown in FIG. 1A, group III-V HEMT 110 is coupled to transistor 120 having drain 122, source 124, gate 126. According to the implementation shown in FIG. 1A, transistor 120 is coupled between substrate 101 of group III-V HEMT 110 and ground, and also has a control terminal, shown in FIG. 1A as gate 126, coupled, i.e., electrically coupled, to gate 116 of group III-V HEMT 110. Also shown in FIG. 1A is body diode 128 of transistor 120, and semiconductor die 118 providing substrate 101.

Group III-V HEMT 110 may be implemented as a III-Nitride HEMT, such as a gallium nitride (GaN) based HEMT, for example, configured to produce a two-dimensional electron gas (2-DEG). According to one implementation, group III-V HEMT 110 may be a high voltage (HV) device, as described above in the "Definition" section. For example, group III-V HEMT 110 may be configured to sustain a drain voltage of approximately six hundred volts (600V) and to have a gate rating of approximately 40V.

Transistor 120 may be an HV group IV transistor, in the form of a vertical or lateral device. For example, transistor 120 may be implemented as a vertical or lateral HV group IV metal-insulator-semiconductor field-effect transistor (MISFET), such as a vertical or lateral HV silicon metal-oxide-semiconductor FET (MOSFET), for example. According to one implementation, transistor 120 may take the form of an HV MOSFET or MISFET implemented as a double-diffused MOSFET or MISFET (hereinafter "DMOS transistor"). As shown in FIG. 1A, in some implementations, transistor 120 may be a p-channel MOSFET or MISFET (hereinafter "PMOS transistor"), such as a p-channel DMOS transistor, having drain 122 electrically coupled to substrate 101 of group III-V HEMT 110, and having gate 126 electrically coupled to gate 116 of group III-V HEMT 110.

It is noted that although FIG. 1A represents transistor 120 as a MOSFET or MISFET including drain 122, source 124, gate 126, and body diode 128, in other implementations, transistor 120 may take the form of another type of transistor. For example, transistor 120 may be implemented as a VMOS, UMOS, HEXFET®, or trench FET, to name a few suitable transistor types.

According to the exemplary implementation shown in FIG. 1A, group III-V HEMT 110 may be an enhancement mode (normally off) HV III-Nitride or other group III-V HEMT situated over substrate 101 provided by semiconductor die 118. Moreover, transistor 120 may be implemented as a depletion mode HV silicon or other group IV PMOS transistor, such as a p-channel DMOS transistor, for example, having drain 122 electrically coupled to substrate 101, source 124 electrically coupled to ground, and gate 126 electrically coupled to gate 116 of group III-V HEMT 110.

The operation of exemplary group III-V HEMT 110 and transistor 120 shown in FIG. 1A will now be described. When no driving voltage is applied to gate 116, i.e., voltage at gate 116 is substantially zero, enhancement mode group III-V HEMT 110 is in the blocking or off-state, depletion mode PMOS transistor 120 is in the conducting or on-state, and substrate 101 is electrically coupled to ground by transistor 120. However, when a driving voltage is applied to gate 116, e.g., a +15V driving voltage, enhancement mode group III-V HEMT 110 switches to the on-state, and depletion mode PMOS transistor 120 switches to the off-state. As a result, transistor 120 is configured to selectably couple substrate 101 to ground when group III-V HEMT 110 is in the off-state, and to selectably decouple substrate 101 from ground and cause substrate 101 to float when group III-V HEMT 110 is in the on-state.

It is noted that according to the specific example shown in FIG. 1A, group III-V HEMT 110 and transistor 120 are monolithically integrated on substrate 101 provided by semiconductor die 118. Examples of monolithically integrated group III-V transistors and group IV devices are disclosed in U.S. Pat. No. 7,915,645, entitled "Monolithic Vertically Integrated Composite Group III-V and Group IV Semiconductor Device and Method for Fabricating Same", filed on May 28, 2009, and issued on Mar. 29, 2011; U.S. Pat. No. 8,557,644, entitled "Method for Fabricating a Monolithic Integrated Composite Group III-V and Group IV Semiconductor Device", filed on Feb. 15, 2011, and issued on Oct. 15, 2013; U.S. Pat. No. 8,981,380, entitled "Monolithic Integration of Silicon and Group III-V Devices", filed on Dec. 3, 2010, and issued on Mar. 17, 2015; U.S. patent application Ser. No. 12/174,329, entitled "III-Nitride Device", filed on Jul. 16, 2008, and published as U.S. Patent Application Publication Number 2009/0050939 on Feb. 26, 2009; and U.S. patent application publication Ser. No. 13/945,276, entitled "Integrated III-Nitride and Silicon Device", filed on Jul. 18, 2013, and published as U.S. Patent Application Publication Number 2013/0299877 on Nov. 14, 2013. The disclosures in the above-referenced patents and patent applications are hereby incorporated fully by reference into the present application.

Figure 1B:
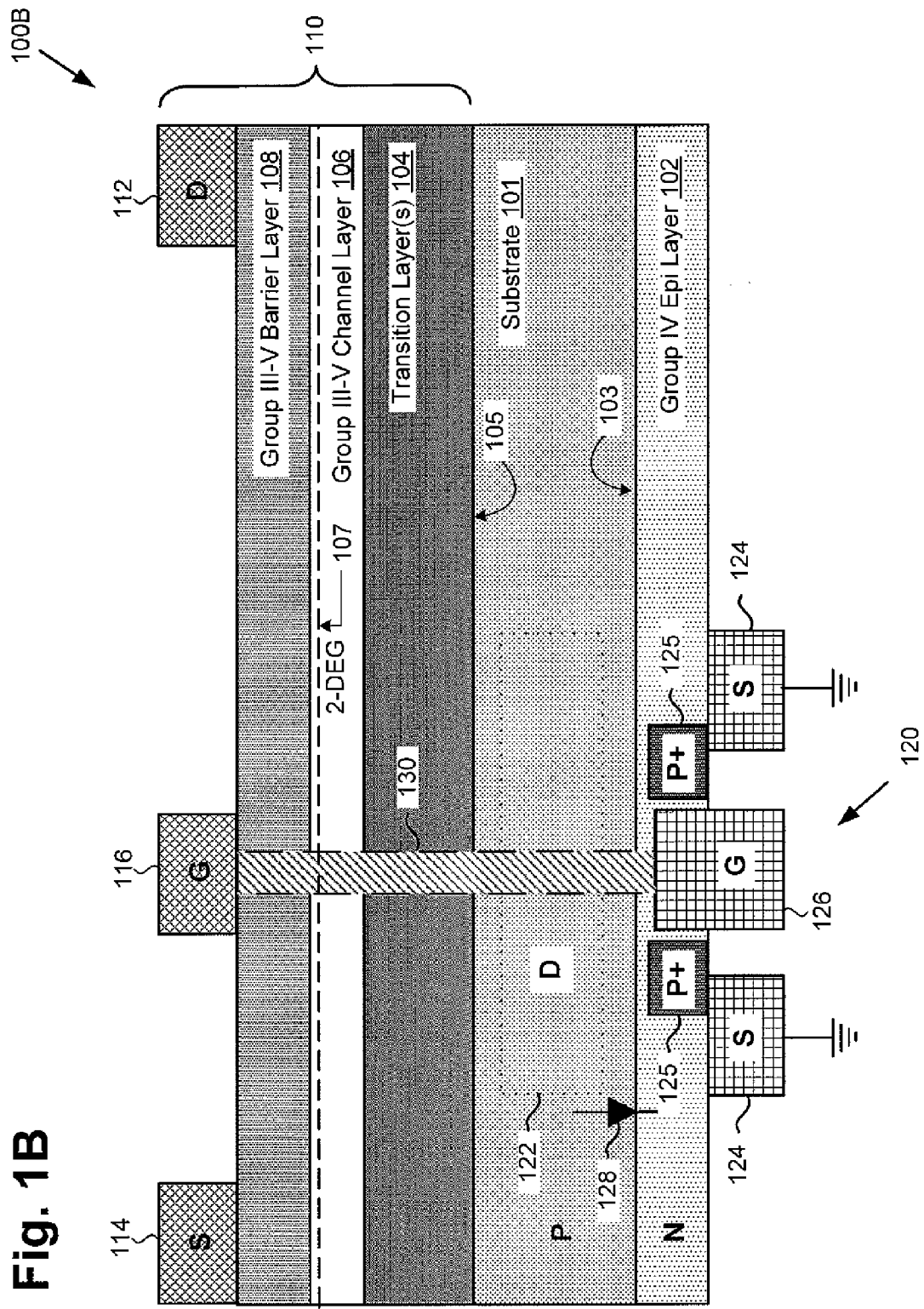
FIG. 1B shows a cross-sectional view of an exemplary group III-V HEMT having a selectably floating substrate that corresponds to the diagram shown in FIG. 1A, according to one implementation.

Moving to FIG. 1B, FIG. 1B shows a cross-sectional view of an exemplary group III-V HEMT having a selectably floating substrate that corresponds to diagram 100A in FIG. 1A, according to one implementation. Structure 100B includes group III-V HEMT 110 situated over substrate 101 and having drain 112, source 114, and gate 116, and further includes transistor 120 having drain 122, source 124, gate 126, and body diode 128. According to the implementation shown in FIG. 1B, transistor 120 is coupled between substrate 101 of group III-V HEMT 110 and ground, and has gate 126 electrically coupled to gate 116 of group III-V HEMT 110 by through-substrate via 130. Group III-V HEMT 110, substrate 101, and transistor 120 correspond respectively to the features identified by reference numbers 110, 101, and 120 in FIG. 1A and described above.

According to the exemplary implementation shown in FIG. 1B, substrate 101 is a P type substrate having first major surface 105 and second major surface 103 opposite first major surface 105. Substrate 101 may be formed of any commonly utilized substrate material. For example, substrate 101 may be a group IV substrate, such as a silicon substrate, as described in greater detail above in the "Definition" section.

Group III-V HEMT 110 includes transition layer or layers 104, group III-V channel layer 106, and group III-V barrier layer 108, all situated over first major surface 105 of substrate 101. Transition layer(s) 104 may include multiple group III-V layers. According to one implementation, transition layer(s) 104 may also include a strain-absorbing layer formed over first major surface 105 of substrate 101. Such a strain-absorbing layer may be an amorphous strain-absorbing layer, for example, an amorphous silicon nitride layer. It is noted that transition layer(s) 104 is/are provided to mediate the transition in lattice properties from group IV substrate 101 to group III-V channel layer 106 and group III-V barrier layer 108.

In one implementation, transition layer(s) 104 may include a nucleation layer in addition to a layer or layers formed so as to reduce the net mismatch in thermal coefficient of expansion between substrate 101 and later formed group III-V active layers, such as group III-V channel layer 106 and group III-V barrier layer 108. For instance, when forming a GaN based HEMT, transition layer(s) 104 may include an aluminum nitride (AlN) layer formed on substrate 101, or on a stress reducing layer and/or a nucleation layer formed on substrate 101, and may further include a series of intermediate layers, such as AlGaN layers having a progressively reduced aluminum content relative to their gallium content, until a suitable transition to a GaN buffer layer included in transition layer(s) 104 is achieved. Moreover, in some implementations, transition layer(s) 104 may take the form of a compositionally graded body including one or more layers having different group III-V alloy compositions at respective top and bottom surfaces. It is noted that the specific compositions and thicknesses of transition layer(s) 104 may depend on the diameter and thickness of substrate 101, and the desired performance of group III-V HEMT 110.

As shown in FIG. 1B, group III-V channel layer 106 is formed over transition layer(s) 104, and group III-V barrier layer 108 is formed over group III-V channel layer 106. As further shown in FIG. 1B, group III-V channel layer 106 and group III-V barrier layer 108 are configured to produce 2-DEG 107 near their heterostructure interface. In one implementation, for example, a group III-V HEMT 110 may take the form of a III-Nitride HEMT having a GaN layer as group III-V channel layer 106 and an AlGaN layer as group III-V barrier layer 108.

Transistor 120 is shown as a vertical PMOS transistor fabricated in P type substrate 101 and N type group IV epitaxial layer 102 formed over second major surface 103 of substrate 101. Also shown in FIG. 1B are highly doped P+ source regions 125 of transistor 120 formed in N type group IV epitaxial layer 102. As further shown in FIG. 1B, P type substrate 101 provides drain 122 of transistor 120, while the interface between P type substrate 101 and N type group IV epitaxial layer 102 provides body diode 128 of transistor 120. Thus, according to the implementation shown in FIG. 1B, group III-V HEMT 110 and transistor 120 are monolithically integrated on substrate 101. Moreover, because drain 122 of transistor 120 is formed in substrate 101, and source 124 of transistor 120 is tied to ground, as shown in FIG. 1B, substrate 101 is coupled to ground when transistor 120 is in the conducting or on-state and is decoupled from ground and floating when transistor 120 is in the blocking or off-state.

As noted above, in some implementations, group III-V HEMT 110 and transistor 110 may be implemented as HV transistors. Regardless of the specific voltage rating of group III-V HEMT 110 however, it may be advantageous or desirable to implement transistor 120 such that transistor 120 has a breakdown voltage no less than that of group III-V HEMT 110. That is to say, in some implementations, transistor 120 is configured to have a breakdown voltage greater than or approximately equal to the breakdown voltage of group III-V HEMT 110.

Gate 126 of transistor 120 is shown to be electrically coupled to gate 116 of group III-V HEMT 110 by conductive via 130 extending through substrate 101, i.e., through-substrate via 130. It is noted that through-substrate via 130 is shown having dashed sidewalls to indicate that the electrical coupling provided by through-substrate via 130 is provided in the third dimension relative to the cross-section shown in FIG. 1B. In other words, through-substrate via 130 is depicted in FIG. 1B as though "seen through" portions of group IV epitaxial layer 102, substrate 101, transition layer(s) 104, group III-V channel layer 106, and group III-V barrier layer 108. It is further noted that 2-DEG 107 is shown as being continuous through the depiction of through-substrate via 130 to indicate that the presence of through-substrate via 130 in the third dimension does not interrupt 2-DEG 107 between drain 112 and source 114 of group III-V HEMT 110.

As noted above by reference to FIG. 1A, according to the present exemplary implementation, group III-V HEMT 110 takes the form of an enhancement mode group III-V HEMT, while transistor 120 takes the form of a depletion mode group IV PMOS transistor. Thus, when no driving voltage is applied to gate 116, enhancement mode group III-V HEMT 110 is in the off-state, depletion mode PMOS transistor 120 is in the on-state, and substrate 101 is electrically coupled to ground by drain 122 and source 124 of transistor 120. However, when a driving voltage is applied to gate 116, enhancement mode group III-V HEMT 110 switches to the on-state, and depletion mode PMOS transistor 120 switches to the off-state. As a result, transistor 120 is configured to selectably couple substrate 101 to ground when group III-V HEMT 110 is in the off-state, and to selectably decouple substrate 101 from ground and cause substrate 101 to float when group III-V HEMT 110 is in the on-state. Consequently, group III-V HEMT 110 having selectably floating substrate 101 is configured to reduce or substantially eliminate the undesirable increase in d-$R_{dson}$ during pulsed operation seen in the conventional art.

Figure 2A:
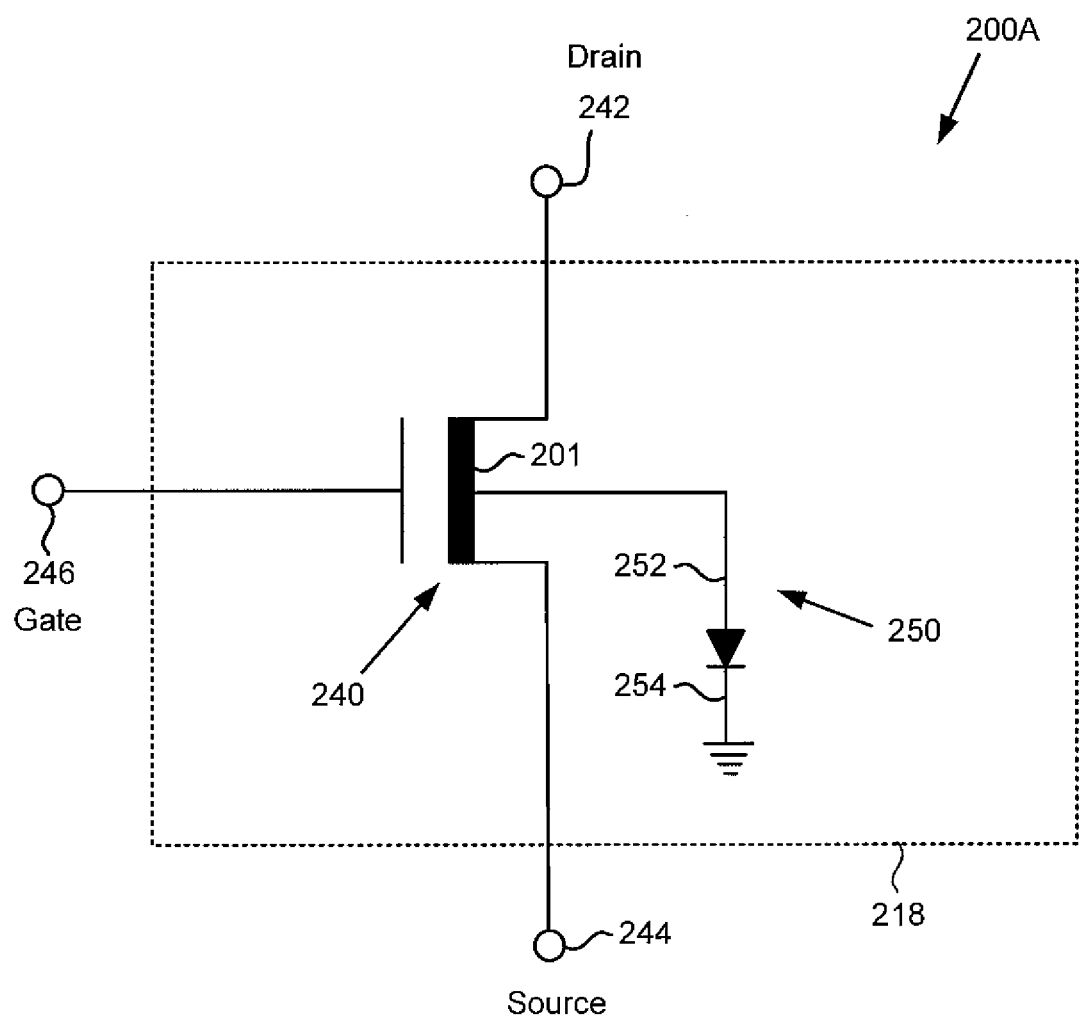
FIG. 2A shows a diagram of an exemplary group III-V HEMT having a selectably floating substrate, according to another implementation.

Referring to FIG. 2A, FIG. 2A shows diagram 200A of an exemplary group III-V HEMT having a selectably floating substrate, according to another implementation. Diagram 200A shows group III-V HEMT 240 having drain 242, source 244, and gate 246. As further shown in FIG. 2A, group III-V HEMT 240 is coupled to diode 250 having anode 252 and cathode 254. According to the implementation shown in FIG. 2A, substrate 201 of group III-V HEMT provides anode 252 of diode 250, while cathode 254 of diode 250 is coupled to ground. It is noted that diode 250 is coupled between substrate 201 and ground so as to enable substrate 201 to be selectably floating or grounded. Also shown in FIG. 2A is semiconductor die 218 including substrate 201.

Group III-V HEMT 240 may be implemented as either a depletion mode (normally on) or as an enhancement mode (normally off) HEMT situated over substrate 201 and configured to produce a 2-DEG. For example, group III-V HEMT 240 may take the form of a depletion mode or enhancement mode III-Nitride HEMT, such as a GaN based HEMT. According to one implementation, group III-V HEMT 240 may be an HV transistor, as described above in the "Definition" section. For example, group III-V HEMT 240 may be configured to sustain a drain voltage of approximately 600V and to have a gate rating of approximately 40V. Diode 250 may be a group IV diode, such as a silicon diode, for example. Moreover, in some implementations, diode 250 may be implemented as an HV diode having a breakdown voltage greater than or approximately equal to the breakdown voltage of group III-V HEMT 240.

Significantly, substrate 201 of group III-V HEMT 240 is at a negative voltage when group III-V HEMT 240 is in a conducting or on-state, and is at a positive voltage when group III-V HEMT 240 is in a blocking or off-state. As a result, diode 250 is reverse biased when group III-V HEMT 240 is in the on-state, and is forward biased when group III-V HEMT 240 is in the off-state. Consequently, diode 250 is configured to ground substrate 201 when group III-V HEMT 240 is in the off-state and to cause substrate 201 to float when group III-V HEMT 240 is in the on-state. Furthermore, it is noted that according to the specific example shown in FIG. 2A, group III-V HEMT 240 and diode 250 are monolithically integrated on substrate 201 of semiconductor die 218.

Figure 2B:
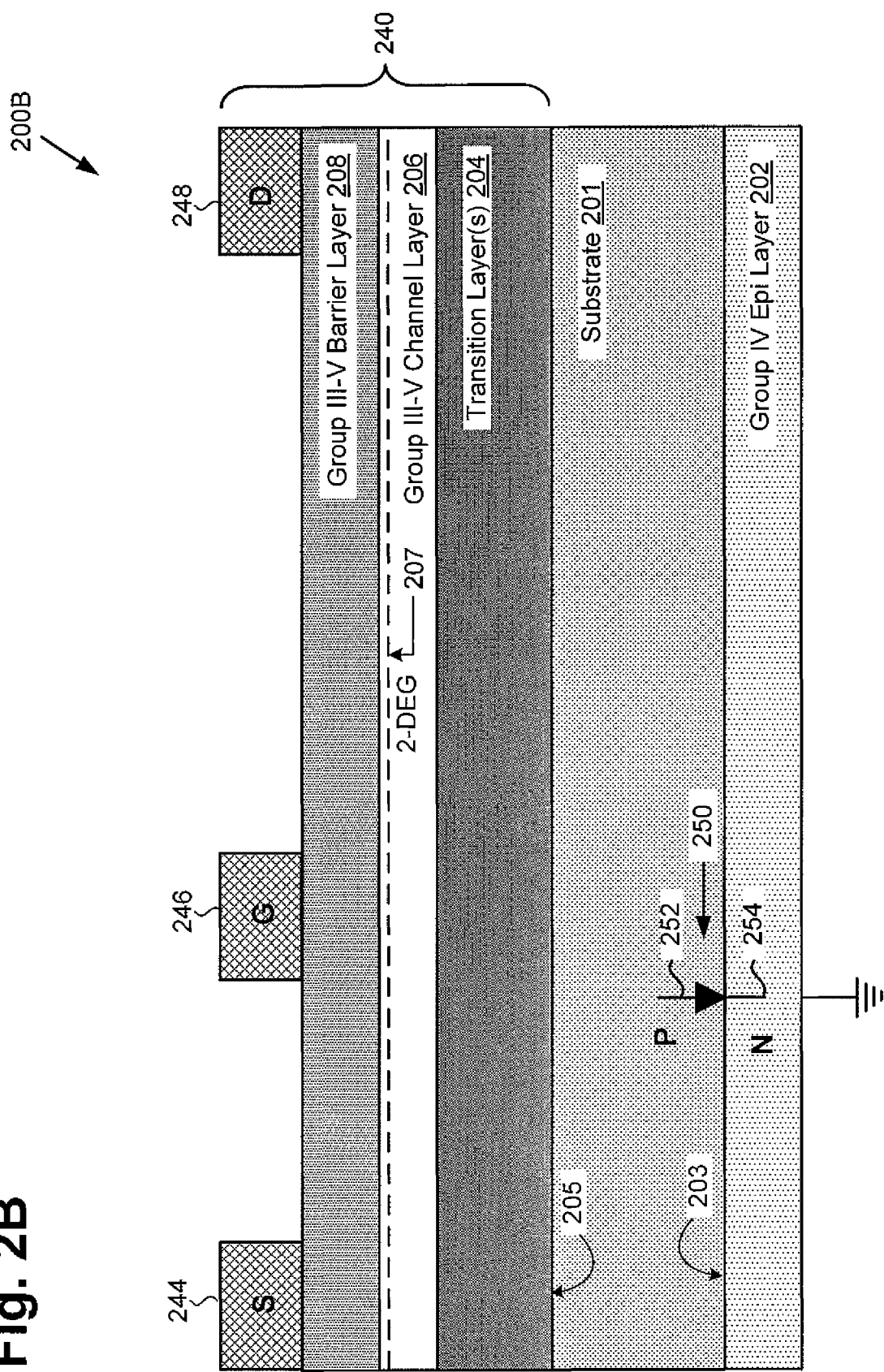
FIG. 2B shows a cross-sectional view of an exemplary group III-V HEMT having a selectably floating substrate that corresponds to the diagram shown in FIG. 2A, according to one implementation.

Continuing to FIG. 2B, FIG. 2B shows a cross-sectional view of an exemplary group III-V HEMT having a selectably floating substrate that corresponds to diagram 200A in FIG. 2A, according to one implementation. Structure 200B includes group III-V HEMT 240 situated over substrate 201 and having drain 242, source 244, and gate 246, and further includes diode 250 having anode 252 and cathode 254. According to the implementation shown in FIG. 2B, substrate 201 of group III-V HEMT provides anode 252 of diode 250, while cathode 254 of diode 250 is coupled to ground. Diode 250 is coupled between substrate 201 and ground so as to enable substrate 201 to be selectably floating or grounded.

Group III-V HEMT 240, substrate 201, and diode 250 correspond respectively to the features identified by reference numbers 240, 201, and 250 in FIG. 2A and described above. Moreover, substrate 201 corresponds to substrate 101 in FIG. 1A and FIG. 1B, and may share any of the characteristics attributed to that corresponding feature, above. For example, and as shown in FIG. 2B, substrate 201 may be a P type substrate having first major surface 205 and second major surface 203 opposite first major surface 205. As noted above by reference to corresponding substrate 101 in FIGS. 1A and 1B, substrate 201 may be formed of any commonly utilized substrate material. For example, substrate 201 may be a group IV substrate, such as a silicon substrate, as described in greater detail above in the "Definition" section.

Structure 200B further includes transition layer(s) 204, group III-V channel layer 206, group III-V barrier layer 208, and 2-DEG 207, all situated over first major surface 205 of substrate 201, as well as group IV epitaxial layer 202 formed below substrate 201 at second major surface 203. Transition layer(s) 204, group III-V channel layer 206, group III-V barrier layer 208, and 2-DEG 207 corresponding respectively to transition layer(s) 104, group III-V channel layer 106, group III-V barrier layer 108, and 2-DEG 107, in FIG. 1B, and may share any of the characteristics attributed to those corresponding features, above. In addition, although not shown in FIG. 2B, structure 200B may also include the strain-absorbing and/or nucleation layers discussed above by reference to structure 100B, in FIG. 1B. Moreover, group IV epitaxial layer 202, in FIG. 2B, corresponds to group IV epitaxial layer 102, in FIG. 1B, and may share any of the characteristics attributed to that corresponding feature, above.

Diode 250 is shown as a PN junction diode fabricated in P type substrate 201 and N type group IV epitaxial layer 202 formed at second major surface 203 of substrate 201. As further shown in FIG. 2B, P type substrate 201 provides anode 252 of diode 250, while grounded N type group IV epitaxial layer 202 provides cathode 254 of diode 250. Thus, according to the implementation shown in FIG. 2B, group III-V HEMT 240 and diode 250 are monolithically integrated on substrate 201.

As noted above, in some implementations, group III-V HEMT 240 and diode 250 may be implemented as HV devices. Regardless of the specific voltage rating of group III-V HEMT 240, however, it may be advantageous or desirable to implement diode 250 such that diode 250 has a breakdown voltage no less than that of group III-V HEMT 240. That is to say, in some implementations, diode 250 is configured to have a breakdown voltage greater than or approximately equal to the breakdown voltage of group III-V HEMT 240.

As noted above by reference to FIG. 2A, substrate 201 of group III-V HEMT 240 is at a negative voltage when group III-V HEMT 240 is in a conducting or on-state, and is at a positive voltage when group III-V HEMT 240 is in a blocking or off-state. As a result, diode 250 is reverse biased when group III-V HEMT 240 is in the on-state, and is forward biased when group III-V HEMT 240 is in the off-state. Consequently, diode 250 is configured to ground substrate 201 when group III-V HEMT 240 is in the off-state and to cause substrate 201 to float when group III-V HEMT 240 is in the on-state. Thus, group III-V HEMT 240 having selectably floating substrate 201 is configured to reduce or substantially eliminate the undesirable increase in d-$R_{dson}$ during pulsed operation seen in the conventional art.

In power management applications where normally-off characteristics of power devices are required, a depletion mode (normally-on) group III-V HEMT can be cascoded with an enhancement mode (normally-off) group IV transistor to produce an enhancement mode composite transistor. Various implementations of cascoded group III-V transistors with group IV MOSFETs, for example, are disclosed in U.S. Pat. No. 8,017,978, entitled "Hybrid Semiconductor Device", filed on Mar. 10, 2006, and issued on Sep. 13, 2011; and U.S. Pat. No. 8,368,120, entitled "Hybrid Semiconductor Device Having a GaN Transistor and a Silicon MOSFET", filed on Sep. 2, 2011, and issued on Feb. 5, 2013. The disclosures in the above-referenced patents are hereby incorporated fully by reference into the present application.

Figure 3A:
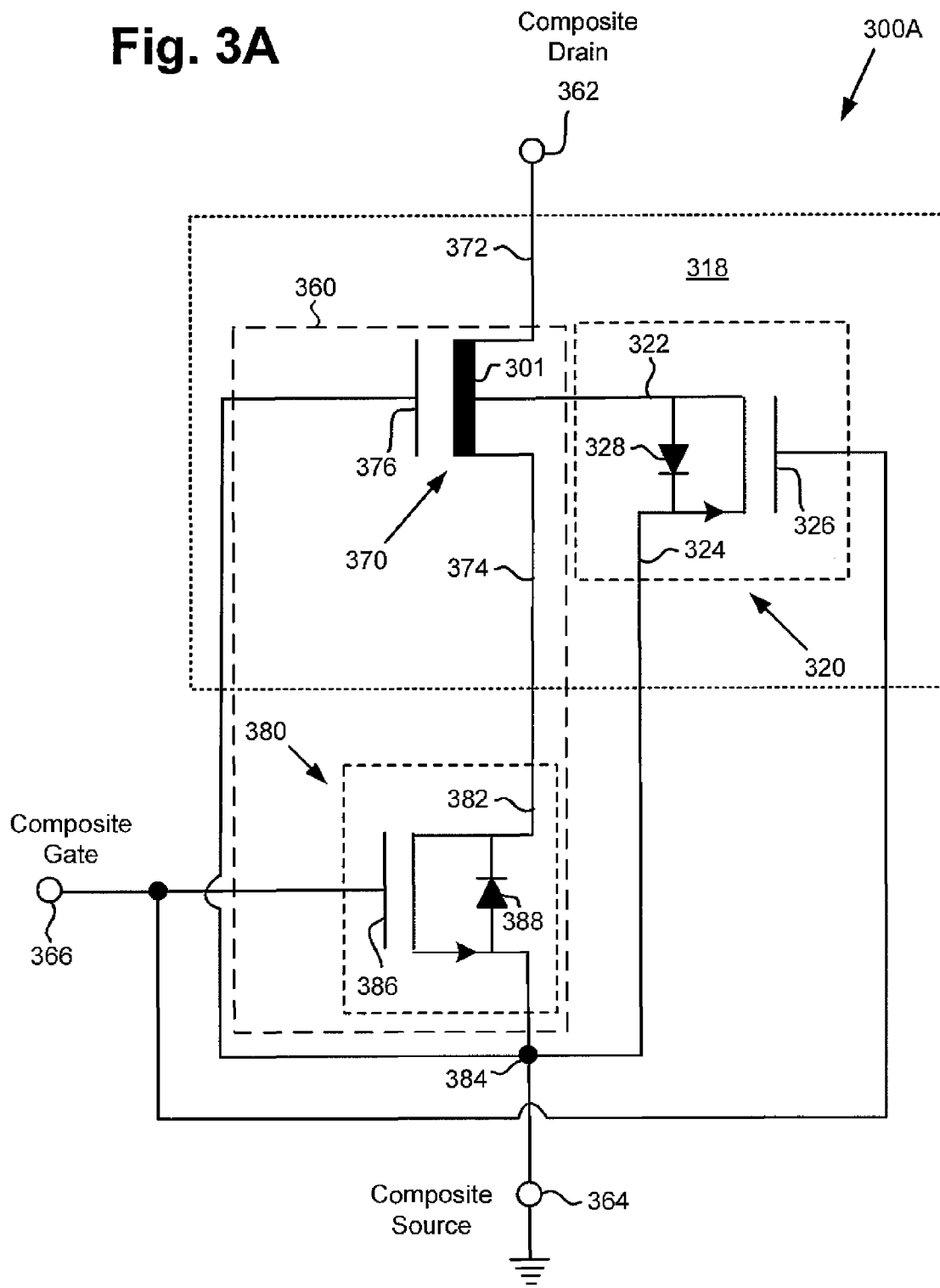
FIG. 3A shows a diagram of a composite transistor including an exemplary group III-V HEMT having a selectably floating substrate, according to one implementation.

Referring to FIG. 3A, FIG. 3A shows a diagram of a composite transistor including an exemplary group III-V HEMT having a selectably floating substrate, according to one implementation. As shown in FIG. 3A, composite transistor 300A includes group III-V HEMT 370 cascoded with enhancement mode group IV FET 380 to produce enhancement mode composite FET 360. That is to say, drain 382 of enhancement mode group IV FET 380 is electrically coupled to source 374 of group III-V HEMT 370, and source 384 of enhancement mode group IV FET 380 is electrically coupled to gate 376 of group III-V HEMT 370 and provides composite source 364. In addition, gate 386 of enhancement mode group IV FET 380 provides composite gate 366, and drain 372 of group III-V HEMT 370 provides composite drain 362.

As further shown in FIG. 3A, composite transistor 300A also includes transistor 320 having drain 322 electrically coupled to substrate 301 of group III-V HEMT 370, source 324 electrically coupled to gate 376 of group III-V FET 370 and to source 384 of enhancement mode group IV FET 380, and gate 326 electrically coupled to gate 386 of enhancement mode group IV FET 380. Also shown in FIG. 3A are body diode 328 of transistor 320, body diode 388 of enhancement mode group IV FET 380, and semiconductor die 318 providing substrate 301.

It is noted that transistor 320 having drain 322, source 324, gate 326, and body diode 328 corresponds to transistor 120 in FIGS. 1A and 1B and may share any of the characteristics attributed to that corresponding feature, above. That is to say, transistor 320 may be implemented as an HV depletion mode PMOS transistor, such as a depletion mode p-channel DMOS transistor, for example. It is further noted that, according to the exemplary implementation shown in FIG. 3A, composite source 364 is electrically coupled to ground, resulting in the concurrent electrical coupling of source 384 of enhancement mode group IV FET 380, source 324 of transistor 320, and gate 376 of group III-V HEMT 370 to ground.

According to the implementation shown in FIG. 3A, group III-V HEMT 370 is typically a depletion mode (normally on) HEMT. However, it is noted that in some implementations group III-V HEMT 370, while not normally in a fully conducting on-state, may require a very low or nearly zero threshold voltage to be turned on. Group III-V HEMT 370 is situated over substrate 301 and is configured to produce a 2-DEG. For example, group HEMT 370 may take the form of a depletion mode III-Nitride HEMT, such as a GaN based HEMT. According to one implementation, group III-V HEMT 370 may be a depletion mode HV device, as described above in the "Definition" section. For example, group III-V HEMT 370 may be configured to sustain a drain voltage of approximately 600V and to have a gate rating of approximately 40V.

As shown in FIG. 3A, enhancement mode group IV FET 380 may be implemented as an enhancement mode n-channel MISFET, such as an N type MOSFET, including drain 382, source 384, gate 386, and body diode 388. Moreover, enhancement mode group IV FET 380 may be implemented as an LV group IV FET, even when group III-V HEMT 370 is implemented as an HV HEMT. For example, enhancement mode group IV FET 380 may take the form of an LV silicon or other group IV FET having a breakdown voltage of approximately 25V, for example. The cascoded combination of group III-V HEMT 370 with enhancement mode group IV FET 380 produces a composite three terminal device functioning in effect as enhancement mode composite FET 360 providing composite drain 362, composite source 364, and composite gate 366.

The operation of composite transistor 300A will now be described under the alternative exemplary conditions wherein composite gate 366 is biased at 0V and wherein composite gate 366 is biased at +15V. When composite gate 366 is biased at 0V, enhancement mode group IV FET 380 is in the blocking or off-state. Group III-V HEMT 370 may be initially in the conducting or on-state when composite gate 366 is biased to 0V. However, group III-V HEMT 370 will rapidly switch to the off-state as the drain-to-source voltage across enhancement mode group IV FET 380 becomes substantially equal to the pinch-off voltage of group III-V HEMT 370, such as approximately 15V, for example. Because gate 326 of transistor 320, implemented as a depletion mode PMOS transistor, is electrically coupled to composite gate 366, biasing composite gate 366 at 0V results in transistor 320 being in the conducting or on-state, thereby coupling substrate 301 of group III-V HEMT to ground while group III-V HEMT 370 is in the off-state.

When composite gate 366 is biased at +15V, enhancement mode group IV FET 380 is in the on-state, resulting in group III-V HEMT 370 being in the on-state as well. Because gate 326 of transistor 320, implemented as a depletion mode PMOS transistor, is electrically coupled to composite gate 366, biasing composite gate 366 at 15V results in transistor 320 being in the off-state, thereby decoupling substrate 301 of group III-V HEMT from ground and causing substrate 301 to float when group III-V HEMT 370 is in the on-state. In other words, transistor 320 is configured to selectably couple substrate 301 to ground when group III-V HEMT 370 is in the off-state, and to selectably decouple substrate 301 from ground and cause substrate 301 to float when group III-V HEMT 370 is in the on-state.

Figure 3B:
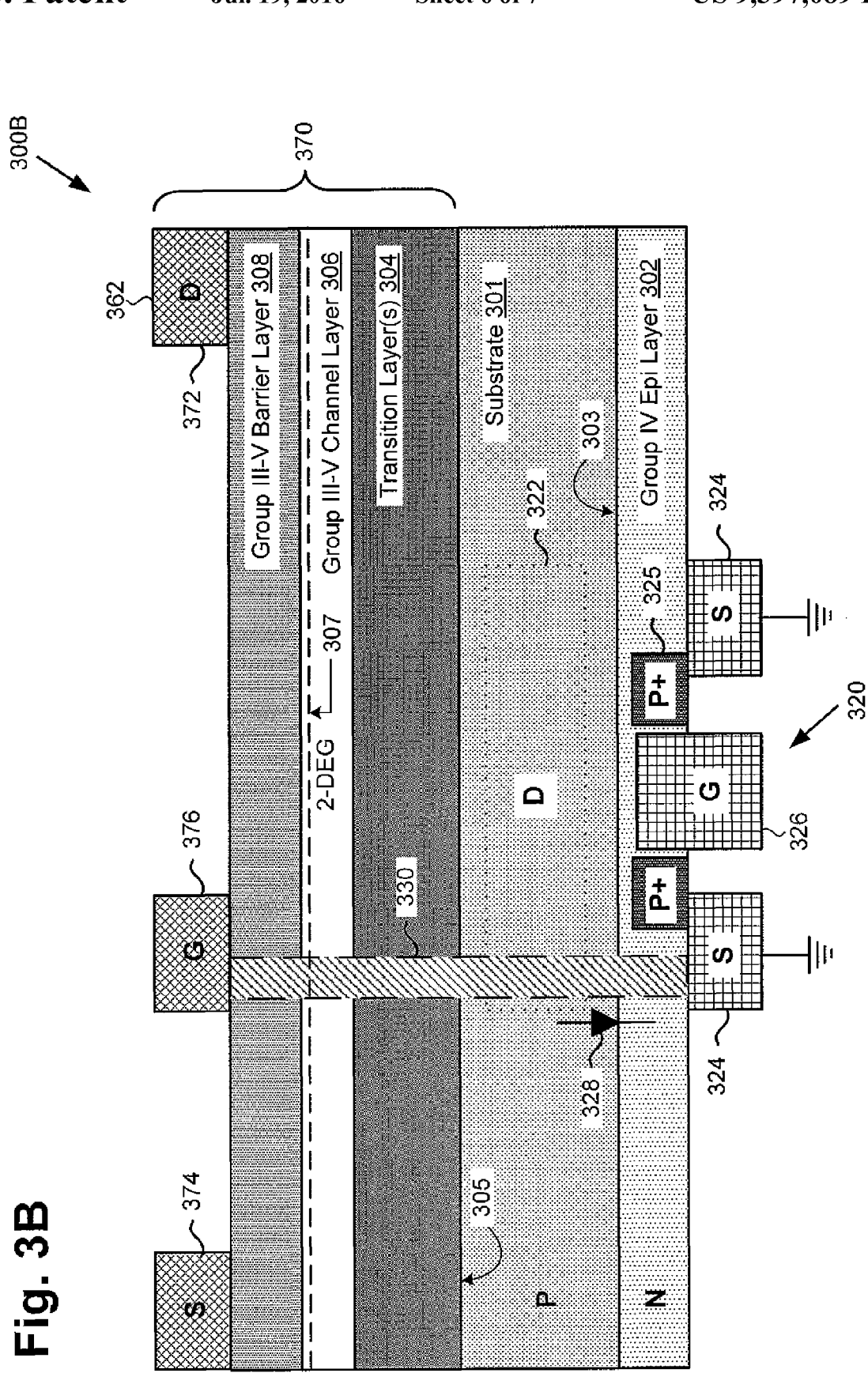
FIG. 3B shows a cross-sectional view of an exemplary group III-V HEMT having a selectably floating substrate suitable for use in the composite transistor shown in FIG. 3A, according to one implementation.

Moving to FIG. 3B, FIG. 3B shows a cross-sectional view of an exemplary group III-V HEMT having a selectably floating substrate suitable for use in the composite transistor shown in FIG. 3A, according to one implementation. Structure 300B includes group III-V HEMT 370 situated over substrate 301 and having drain 372 providing composite drain 362, source 374, and gate 376, and further includes transistor 320 having drain 322, source 324, gate 326, and body diode 328. According to the implementation shown in FIG. 3B, transistor 320 is coupled between substrate 301 of group III-V HEMT 370 and ground, and has source 324 electrically coupled to gate 376 of group III-V HEMT 370 by through-substrate via 330.

Group III-V HEMT 370, substrate 301, composite drain 362, and transistor 320 correspond respectively to the features identified by reference numbers 370, 301, 362, and 320 in FIG. 3A and described above. Moreover, substrate 301 corresponds to substrate 101 in FIG. 1A and FIG. 1B, and may share any of the characteristics attributed to that corresponding feature above. For example, and as shown in FIG. 3B, substrate 301 may be a P type substrate having first major surface 305 and second major surface 303 opposite first major surface 305. As noted above by reference to corresponding substrate 101 in FIGS. 1A and 1B, substrate 301 may be formed of any commonly utilized substrate material. For example, substrate 301 may be a group IV substrate, such as a silicon substrate, as described in greater detail above in the "Definition" section.

Structure 300B further includes transition layer(s) 304, group III-V channel layer 306, group III-V barrier layer 308, and 2-DEG 307, all situated over first major surface 305 of substrate 301, as well as trough-substrate via 330, and group IV epitaxial layer 302 formed below substrate 301 at second major surface 303. Transition layer(s) 304, group III-V channel layer 306, group III-V barrier layer 308, and 2-DEG 307 correspond respectively to transition layer(s) 104, group III-V channel layer 106, group III-V barrier layer 108, and 2-DEG 107, in FIG. 1B, and may share any of the characteristics attributed to those corresponding features, above. In addition, although not shown in FIG. 3B, structure 300B may also include the strain-absorbing and/or nucleation layers discussed above by reference to structure 100B, in FIG. 1B. Moreover, through-substrate via 330 and group IV epitaxial layer 302, in FIG. 3B, correspond respectively to through-substrate via 130 and group IV epitaxial layer 102, in FIG. 1B, and may share any of the characteristics attributed to those corresponding features, above.

Transistor 320 is shown as a vertical PMOS transistor fabricated in P type substrate 301 and N type group IV epitaxial layer 302 formed at second major surface 303 of substrate 301. Also shown in FIG. 3B are highly doped P+ source regions 325 of transistor 320 formed in N type group IV epitaxial layer 302. As further shown in FIG. 3B, P type substrate 301 provides drain 322 of transistor 320, while the interface between P type substrate 301 and N type group IV epitaxial layer 302 provides body diode 328 of transistor 320. Thus, according to the implementation shown in FIG. 3B, group III-V HEMT 370 and transistor 320 are monolithically integrated on substrate 301. Moreover, because drain 322 of transistor 320 is formed in substrate 301, and source 324 of transistor 320 is tied to ground, as shown in FIG. 3B, substrate 301 is coupled to ground when transistor 320 is in the on-state and is decoupled from ground and caused to float when transistor 320 is in the off-state.

As noted above, in some implementations, group III-V HEMT 370 and transistor 320 may be implemented as HV transistors. Regardless of the specific voltage rating of group III-V HEMT 370 however, it may be advantageous or desirable to implement transistor 320 such that transistor 320 has a breakdown voltage no less than that of group III-V HEMT 370. That is to say, in some implementations, transistor 320 is configured to have a breakdown voltage greater than or approximately equal to the breakdown voltage of group III-V HEMT 370.

Source 324 of transistor 320 is shown to be electrically coupled to gate 376 of group III-V HEMT 370 by through-substrate via 330. It is noted that through-substrate via 330 is shown having dashed sidewalls to indicate that the electrical coupling provided by through-substrate via 330 is provided in the third dimension relative to the cross-section shown in FIG. 3B. In other words, through-substrate via 330 is depicted in FIG. 3B as though "seen through" portions of group IV epitaxial layer 302, substrate 301, transition layer(s) 304, group III-V channel layer 306, and group III-V barrier layer 308. It is further noted that 2-DEG 307 is shown as being continuous through the depiction of through-substrate via 330 to indicate that the presence of through-substrate via 330 in the third dimension does not interrupt 2-DEG 307 between drain 372 and source 374 of group III-V HEMT 370.

As noted above by reference to FIG. 3A, according to the present exemplary implementation, group III-V HEMT 370 typically takes the form of a depletion mode group III-V HEMT, while transistor 320 takes the form of a depletion mode group IV PMOS transistor. Thus, when composite gate 366, shown in FIG. 3A to be electrically coupled to gate 326 of transistor 320, is biased at 0V, depletion mode group III-V HEMT 370 is in the off-state, depletion mode PMOS transistor 320 is in the on-state, and substrate 301 is electrically coupled to ground by drain 322 and source 324 of transistor 320. However, when composite gate 366 is biased at 15V, for example, depletion mode group III-V HEMT 370 switches to the on-state, and depletion mode PMOS transistor 120 switches to the off-state. As a result, transistor 320 is configured to selectably couple substrate 301 to ground when group III-V HEMT 370 is in the off-state, and to selectably decouple substrate 301 from ground and cause substrate 301 to float when group III-V HEMT 370 is in the on-state. Consequently, group III-V HEMT 370 having selectably floating substrate 301 is configured to reduce or substantially eliminate the undesirable increase in d-$R_{dson}$ during pulsed operation seen in the conventional art.

Figure 4:
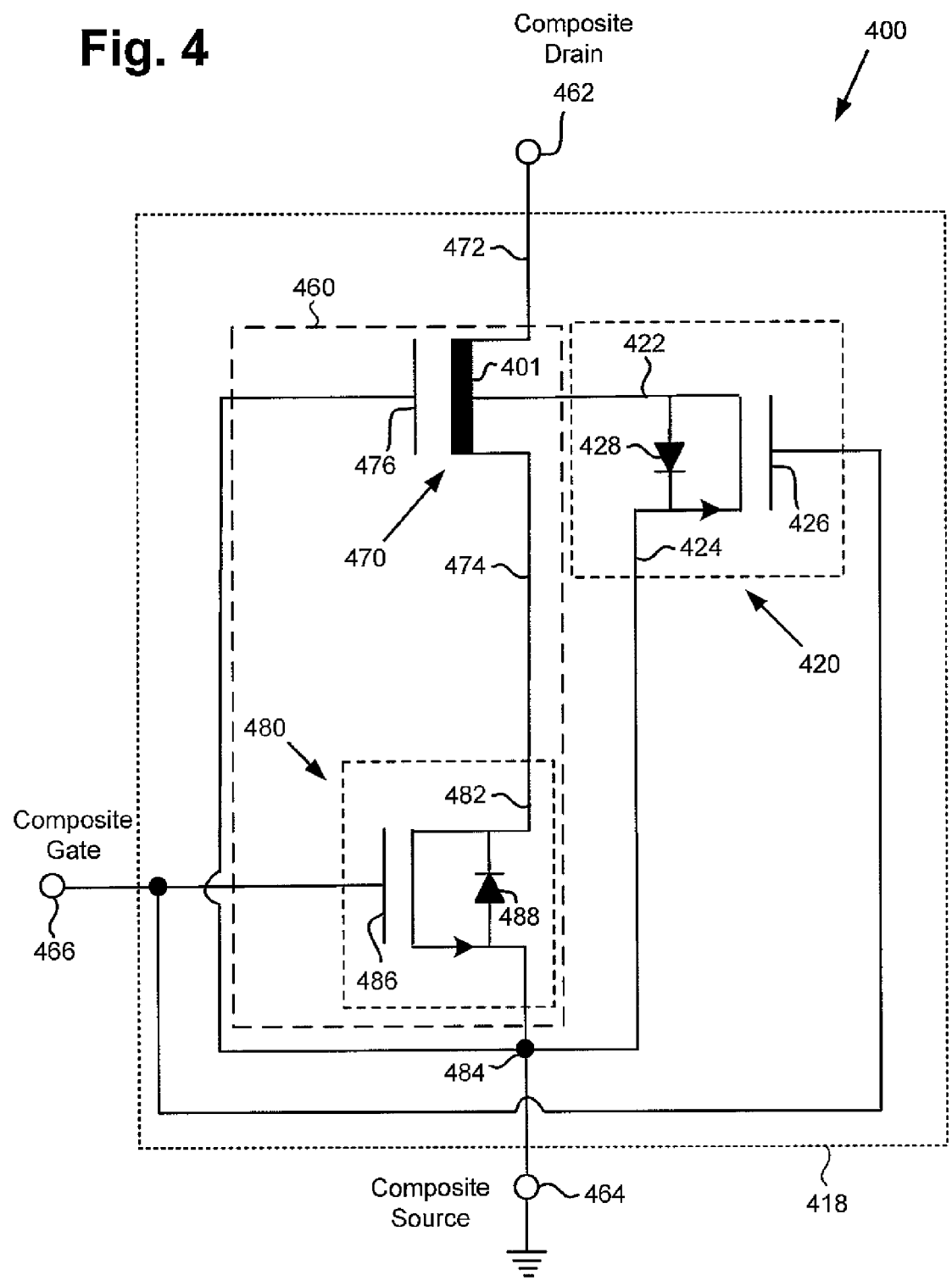
FIG. 4 shows a diagram of a composite transistor including an exemplary group III-V HEMT having a selectably floating substrate, according to another implementation.

Continuing to FIG. 4, FIG. 4 shows a diagram of a composite transistor including an exemplary group III-V HEMT having a selectably floating substrate, according to another implementation. As shown in FIG. 4, composite transistor 400 includes group III-V HEMT 470 cascoded with enhancement mode group IV FET 480 to produce enhancement mode composite FET 460. That is to say, drain 482 of enhancement mode group IV FET 480 is electrically coupled to source 474 of group III-V HEMT 470, and source 484 of enhancement mode group IV FET 480 is electrically coupled to gate 476 of group III-V HEMT 470 and provides composite source 464. In addition, gate 486 of enhancement mode group IV FET 480 provides composite gate 466, and drain 472 of group III-V HEMT 470 provides composite drain 462.

As further shown in FIG. 4, composite transistor 400 also includes transistor 420 having drain 422 electrically coupled to substrate 401 of group III-V HEMT 470, source 424 electrically coupled to gate 476 of group III-V FET 470 and to source 484 of enhancement mode group IV FET 480, and gate 426 electrically coupled to gate 486 of enhancement mode group IV FET 480. Also shown in FIG. 4 are body diode 428 of transistor 420, body diode 488 of enhancement mode group IV FET 480, and semiconductor die 418 providing substrate 401.

It is noted that composite transistor 400 corresponds in general to composite transistor 300A, shown in FIG. 3A. That is to say, group III-V HEMT 470, enhancement mode group IV FET 480, enhancement mode composite FET 460, and transistor 420, in FIG. 4, correspond respectively to group III-V HEMT 370, enhancement mode group IV FET 380, enhancement mode composite FET 360, and transistor 320, in FIG. 3A and may share any of the characteristics attributed to those corresponding features, above. However, composite transistor 400 differs from composite transistor 300A in the extent to which monolithic integration is employed. For example, and as shown in FIG. 4, in some implementations, group III-V HEMT 470, enhancement mode group IV FET 480, and transistor 420 may all be monolithically integrated on common semiconductor die 418. Moreover, in other implementations, any two, but not necessarily all of group III-V HEMT 470, enhancement mode group IV FET 480, and transistor 420 may be monolithically integrated on a common semiconductor die.

Thus, the present application discloses a group III-V HEMT configured to have a selectably floating substrate enabling prevention of the increase in d-$R_{dson}$ seen in the conventional art. By coupling the substrate of the group III-V HEMT to ground when the group III-V HEMT is in an off-state, the performance of the group III-V HEMT is substantially optimized for DC applications. Moreover, by selectably decoupling the group III-V HEMT substrate from ground and causing the substrate to float when the group III-V HEMT is in an on-state, the implementations disclosed herein advantageously reduce or substantially eliminate an increase in d-$R_{dson}$ during pulsed applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A group III-V high electron mobility transistor (HEMT) comprising:
   a substrate;
   said group III-V HEMT situated over said substrate;
   a transistor configured to selectably couple said substrate to ground and to selectably decouple said substrate from ground;
   wherein said transistor grounds said substrate when said group III-V HEMT is in an off-state and causes said substrate to float when said group III-V HEMT is in an on-state.

2. The group III-V HEMT of claim 1, wherein said group III-V HEMT comprises an enhancement mode HEMT.

3. The group III-V HEMT of claim 1, wherein a gate of said group III-V HEMT is electrically coupled to a gate of said transistor.

4. The group III-V HEMT of claim 1, wherein said group III-V HEMT and said transistor are monolithically integrated on said substrate.

5. The group III-V HEMT of claim 1, wherein a gate of said group III-V HEMT is electrically coupled to a gate of said transistor by a through-substrate via.

6. The group III-V HEMT of claim 1, wherein said group III-V HEMT comprises a III-Nitride HEMT.

7. The group III-V HEMT of claim 1, wherein said transistor comprises a group IV p-channel metal-oxide-semiconductor (PMOS) transistor.

8. The group III-V HEMT of claim 1, wherein said transistor comprises a depletion mode group IV PMOS transistor.

9. The group III-V HEMT of claim 1, wherein said transistor has a breakdown voltage greater than or approximately equal to a breakdown voltage of said group III-V HEMT.

10. The group III-V HEMT of claim 1, wherein said transistor comprises a depletion mode p-channel double-diffused MOS (p-channel DMOS) transistor.

11. A III-Nitride high electron mobility transistor (HEMT) comprising:
    a substrate;
    said III-Nitride HEMT situated over said substrate;
    a group IV p-channel metal oxide transistor (PMOS) configured to selectably couple said substrate to ground and to selectably decouple said substrate from ground;
    said group IV PMOS transistor configured to ground said substrate when said III-Nitride HEMT is in an off-state and to cause said substrate to float when said III-Nitride HEMT is in an on-state.

12. The III-Nitride HEMT of claim 11, wherein said III-Nitride HEMT comprises an enhancement mode HEMT.

13. The III-Nitride HEMT of claim 11, wherein a gate of said III-Nitride HEMT is electrically coupled to a gate of said group IV PMOS transistor.

14. The III-Nitride HEMT of claim 11, wherein said III-Nitride HEMT and said group IV PMOS transistor are monolithically integrated on said substrate.

15. The III-Nitride HEMT of claim 11, wherein a gate of said III-Nitride HEMT is electrically coupled to a gate of said group IV PMOS transistor by a through-substrate via.

16. The III-Nitride HEMT of claim 11, wherein said III-Nitride HEMT comprises a high voltage (HV) HEMT.

17. The III-Nitride HEMT of claim 11, wherein said group IV PMOS transistor comprises a silicon PMOS transistor.

18. The III-Nitride HEMT of claim 11, wherein said group IV PMOS transistor comprises a depletion mode transistor.

19. The III-Nitride HEMT of claim 11, wherein said group IV PMOS transistor has a breakdown voltage greater than or approximately equal to a breakdown voltage of said III-Nitride HEMT.

20. The III-Nitride HEMT of claim 11, wherein said group IV PMOS transistor comprises a depletion mode p-channel double-diffused MOS (p-channel DMOS) transistor.

* * * * *